United States Patent
Kanbayashi et al.

[19]

[11] Patent Number: 6,094,348
[45] Date of Patent: *Jul. 25, 2000

[54] MICROCHIP MODULE MOUNTING STRUCTURE

[75] Inventors: Ko Kanbayashi; Toyokazu Hamaguchi, both of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/837,906

[22] Filed: Apr. 11, 1997

[30] Foreign Application Priority Data

Oct. 31, 1996 [JP] Japan .................................. 8-289880

[51] Int. Cl.$^7$ ...................................................... H05H 7/20
[52] U.S. Cl. ...................... 361/704; 174/35 R; 361/720; 361/753; 361/816
[58] Field of Search ................................ 174/16.3, 35 R, 174/35 GC, 51, 252; 257/706–707, 712–713, 718–719, 726–727; 361/687, 704, 707, 710, 719–720, 728, 730, 752, 753, 816, 818

[56] References Cited

U.S. PATENT DOCUMENTS

| | | | |
|---|---|---|---|
| 4,631,641 | 12/1986 | Brombal et al. | 361/818 |
| 4,899,256 | 2/1990 | Sway-Tin | 361/730 |
| 4,916,575 | 4/1990 | Van Asten | 361/715 |
| 4,945,633 | 8/1990 | Hakanen et al. | 361/752 |
| 5,089,935 | 2/1992 | Ito | 361/720 |

FOREIGN PATENT DOCUMENTS 0 702 287 A2  3/1996  European Pat. Off. .

OTHER PUBLICATIONS

Patent Abstracts of Japan: Pub. No. JP 4–284519; Pub. Date Oct. 9, 1992; Partial Translation.
Patent Abstracts of Japan: Pub. No. JP 5–341874; Pub. Date Dec. 24, 1993; Partial Translation.
Patent Abstracts of Japan: Pub. No. JP 61–294528; Pub. Date Dec. 25, 1988; Partial Translation.
Patent Abstracts of Japan: Pub. No. JP 6–318124; Pub. Date Nov. 15, 1994; Partial Translation.
Patent Abstracts of Japan: Pub. No. JP 8–162576; Pub. Date Jun. 21, 1996; Partial Translation.
Patent Abstracts of Japan: Pub. No. JP 8–087364, Pub. Date Apr. 2, 1996 (See EP 0 702 287 above).

*Primary Examiner*—Gregory Thompson
*Attorney, Agent, or Firm*—Staas & Halsey LLP

[57] ABSTRACT

An apparatus such as a portable computer including a microchip module constituted by a substrate and semiconductor chips mounted thereon. The microchip module is surrounded and supported by an annular frame. The microchip module and the annular frame are fixed to a motherboard by screws. A heat-radiating plate is attached to the microchip module to constitute a microchip module unit. The arrangement including the annular frame protects the microchip module from vibration and impact, and improves a grounding function, a heat radiating efficiency, and a shielding function.

27 Claims, 5 Drawing Sheets

6,094,348

MICROCHIP MODULE MOUNTING STRUCTURE

BACKGROUND OF THE INVENTION

1. Field of the Invention

The present invention relates to an apparatus including a microchip module, and in particular, it relates to an apparatus, such as a notebook type personal computer, including a microchip module mounting structure to improve a heat radiating function and a grounding function of the microchip module and to prevent a connector from being undesirably uncoupled.

2. Description of the Related Art

Recently, personal computers have become smaller and notebook-type portable computers have been developed. A typical notebook-type portable computer, as shown in FIG. 5, includes a body 2 having a keyboard 1, a display device 3, and a hinge 4 interconnecting the body 2 and the display device 3 so that the display device 3 is movable relative to the body 2 to act as a cover for the body 2. The keyboard 1 includes keys 5 arranged in rows and columns, and data input from the keyboard 1 are processed by a CPU arranged in the body 2 and displayed by the display device 3.

In the notebook type computer, an attempt has been made to design the apparatus in a more compact size, by designing the CPU as a microchip module. In the conventional notebook type computer, either the CPU is not designed to constitute a microchip module, or the CPU is not a high speed type CPU even when the CPU is designed to constitute a microchip module. In such a notebook type computer, no problems arise in heat radiating capability or a grounding function, so it was not necessary to consider a special design to mount the microchip module to the motherboard of the computer.

However, when the CPU is a high-speed CPU and is designed to constitute a microchip module, it is necessary to improve a heat radiating function and a grounding function and to prevent a connector thereof from being undesirably uncoupled.

SUMMARY OF THE INVENTION

The object of the present invention is to provide an apparatus having a microchip module mounting structure by which it is possible to improve a heat radiating function and a grounding function and to prevent a connector from being undesirably uncoupled.

According to one aspect of the present invention, there is provided an apparatus comprising a substrate having at least one semiconductor chip mounted to the substrate to constitute a microchip module, and an annular frame surrounding the microchip module to support the microchip module.

Preferably, the apparatus further comprises a heat radiating plate arranged on the microchip module to constitute a microchip module unit.

Preferably, the heat radiating plate has a pair of first lateral extensions having first holes therethrough, and said annular frame has a pair of notches to receive said first lateral extensions and a pair of second lateral extensions having second holes therethrough at positions in registration with said first lateral extensions having the first holes.

Preferably, the annular frame is made from metal. In this case, the annular frame also acts as a heat radiating member, and/or the annular frame also acts as a shielding member, and/or the annular frame also acts as a ground member.

According to another aspect of the present invention, there is provided an apparatus comprising a substrate having at least one semiconductor chip mounted to the substrate to constitute a microchip module, an annular frame surrounding the microchip module to support the microchip module, and a heat radiating plate radiating heat induced by the microchip module.

Preferably, the apparatus further comprises a further heat radiating plate separate from the heat radiating plate, the further heat radiating plate being arranged on the microchip module to constitute a microchip module unit.

Preferably, the apparatus further comprises a mechanism fixing the annular frame and the first heat radiating plate together.

According to a further aspect of the present invention, there is provided an apparatus comprising a substrate having at least one semiconductor chip mounted to the substrate to constitute a microchip module, an annular frame surrounding the microchip module to support the microchip module, and a motherboard to which the microchip module with the annular frame is fixed.

Preferably, the apparatus further comprises a heat radiating plate arranged on the microchip module to constitute a microchip module unit.

Preferably, the apparatus further comprises a mechanism fixing the microchip module, the annular frame, and the motherboard together.

Preferably, the apparatus further comprises a mechanism fixing the microchip module, the annular frame, the heat radiating plate, and the motherboard together.

According to a further aspect of the present invention, there is provided an apparatus comprising: a substrate having a first connector and at least one semiconductor chip mounted to said substrate to constitute a microchip module; a first heat radiating plate arranged on said substrate, said first heat radiating plate having at least one first lateral extension having a hole therethrough; an annular frame surrounding said microchip module, said annular frame having at least one notch to receive said at least one first lateral extension and at least one second lateral extension having a second hole at a position therethrough in registration with said at least one first lateral extension having the first hole; a second heat radiating plate radiating heat induced by said microchip module, said second heat radiating plate having a third hole therethrough at a position in registration with said first hole; a motherboard to which said microchip module is connected, said motherboard having a second connector to be coupled with said first connector and a fourth hole therethrough at a position in registration with said first hole; and at least one screw adapted to pass through said first to fourth holes, said second heat radiating plate, said first heat radiating plate, said annular frame, and said motherboard being arranged in this order and fixed together by said at least one screw.

Preferably, the apparatus further comprises a ground pattern arranged on the motherboard, the ground pattern having a shape identical to a shape of a bottom of the annular frame.

Preferably, the annular frame has a top surface and a height, and the first heat radiating plate has a top surface, the height of the annular frame being such that the top surface of the annular frame is flush with the top surface of the first heat radiating plate when the first connector is coupled with the second connector.

Preferably, the annular frame has a generally rectangular shape with four side walls, and the at least one first lateral extension comprises a pair of lateral extensions arranged on a pair of opposite side walls.

Preferably, the second heat radiating plate has one side, and the at least one third lateral extension comprises a pair of lateral extensions arranged on said one side.

Preferably, the apparatus comprises a computer.

Preferably, the at least one semiconductor chip comprises a CPU.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 1:
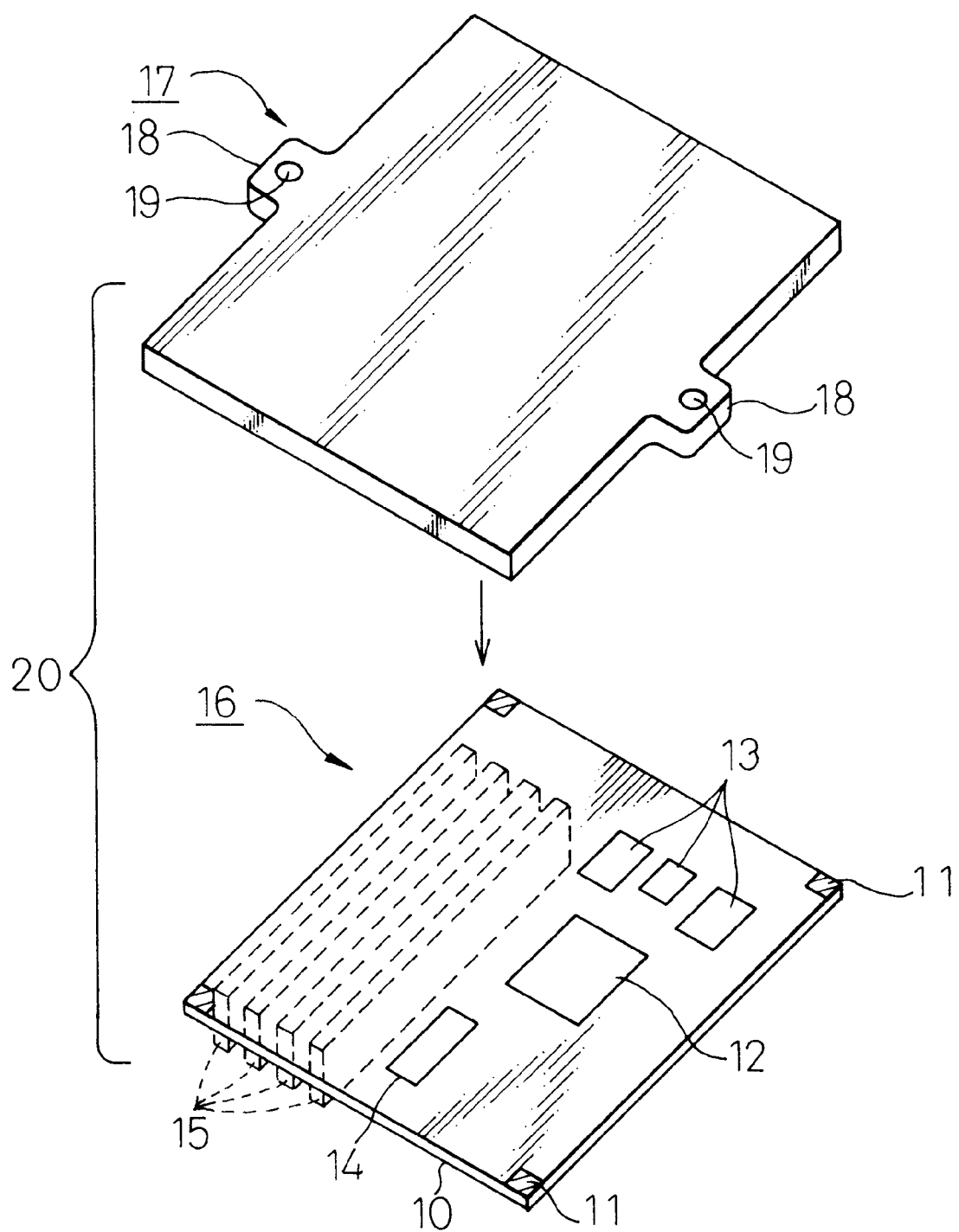
FIG. 1 is an exploded perspective view of a microchip module unit according to the embodiment of the present invention.

FIG. 1 is an exploded perspective view of a microchip module 16, used in a notebook-type computer, according to the present invention. The microchip module 16 comprises a substrate 10 having, at the upper surface thereof, ground patterns 11 located at four corners of the substrate 10, a high speed CPU 12, several semiconductor chips 13, and a DC-DC converter 14. The substrate 10 has, at the lower surface thereof, connectors 15.

A heat radiating plate 17 is arranged on the microchip module 16 to constitute a microchip module unit 20. The heat radiating plate 17 (hereinafter, MCM heat radiating plate) is a relatively small plate having a size slightly greater than the microchip module 16 and made from a good heat conductive metal such as aluminum. The MCM heat radiating plate 17 has a generally rectangular shape and a pair of lateral extensions or projections 18 on the opposite sides of the MCM heat radiating plate 17 at the central region of a pair of opposite sides. A hole 19 is arranged in each of the lateral extensions 18. The MCM unit 20 is formed, by placing the MCM heat radiating plate 17 on the microchip module 16, so that the MCM heat radiating plate 17 closely contacts the ground patterns 11 and the high speed CPU 12, and by joining them together.

Figure 2:
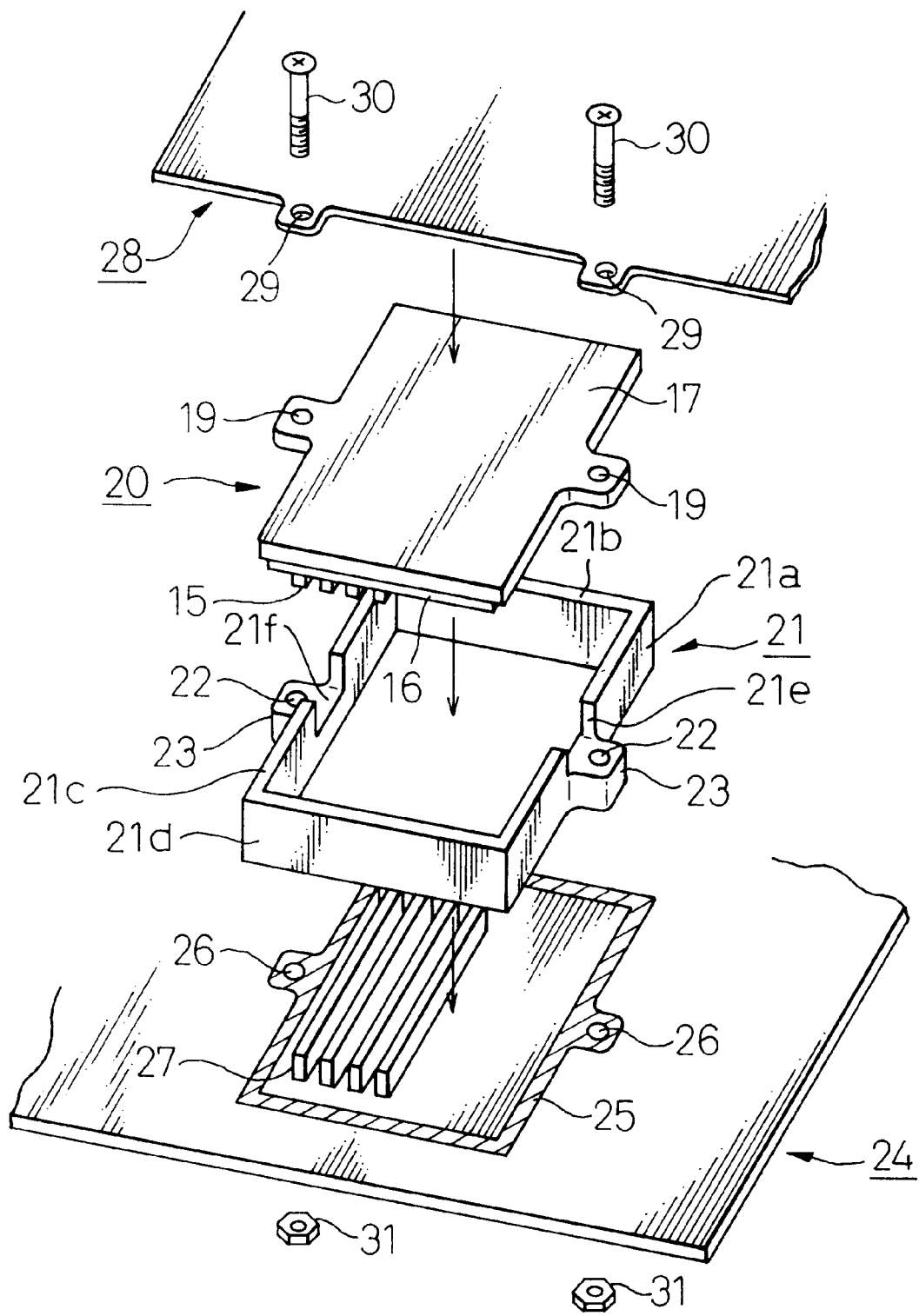
FIG. 2 is an exploded perspective view of a portion of a notebook type computer including the microchip module unit of FIG. 1.
Figure 3:
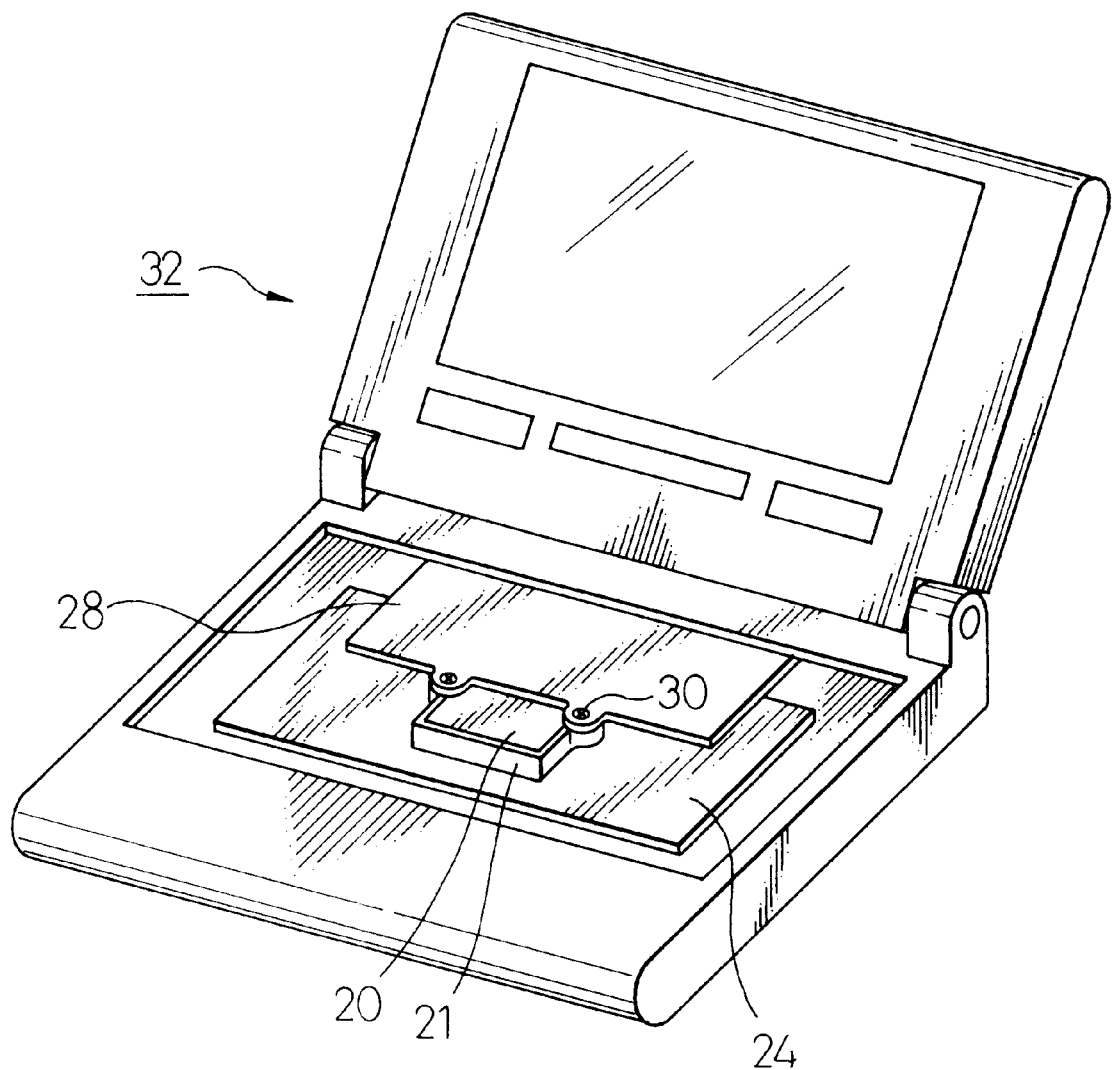
FIG. 3 is a perspective view of the notebook type computer of FIG. 2, with a keyboard not shown in the figure.

FIG. 2 is an exploded perspective view of a portion of a notebook type computer including the MCM unit 20 of FIG. 1, and FIG. 3 is a perspective view of the notebook type computer of FIG. 2, with a keyboard not shown in FIG. 3 to show the interior of the computer.

In FIG. 2, an annular frame 21 is provided to surround the MCM unit 20 and to support the MCM unit 20. The annular frame 21 has a generally rectangular shape and thus four side walls 21a to 21d. The annular frame 21 is preferably made from metal, but it can be made from other material such as plastics or ceramics. The annular frame 21 has a pair of notches 21e and 21f on a pair of opposite side walls 21a and 21c. The notches 21e and 21f extend from the tops of the side walls 21a and 21c to the midways thereof to receive the lateral extensions 18 therein when the MCM unit 20 is inserted in the annular frame 21. The annular frame 21 also has a pair of lateral extensions or projections 23 having holes 22 at positions in register with the lateral extensions 18 having holes 19 of the MCM unit 20. The lateral extensions 23 are located just below the notches 21e and 21f.

Figure 4:
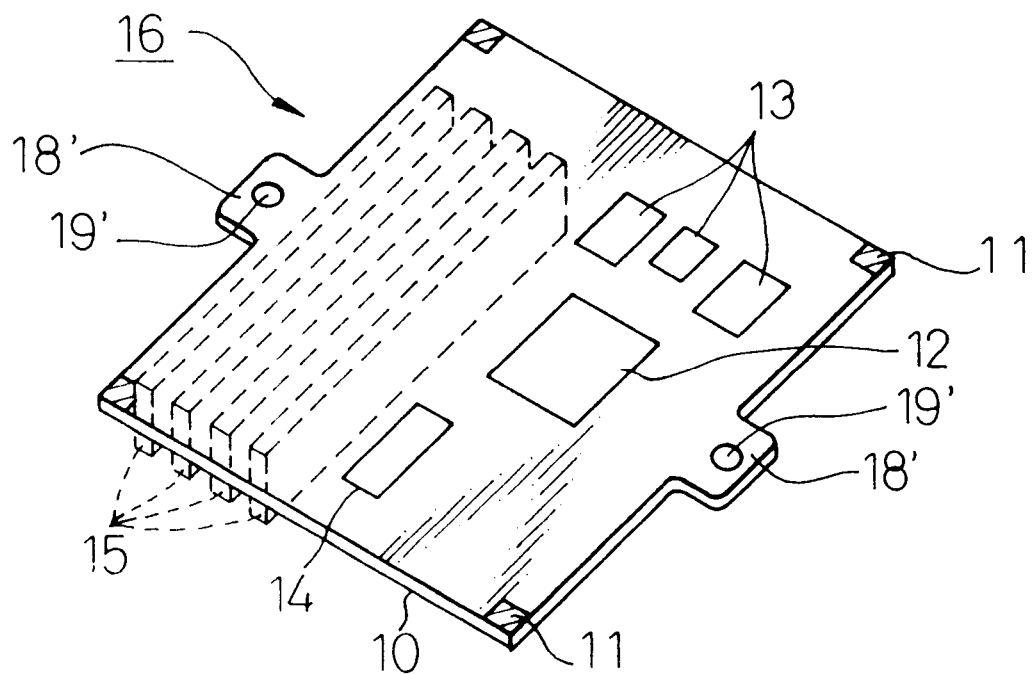
FIG. 4 is a perspective view of a modified example of a microchip module.
Figure 5:
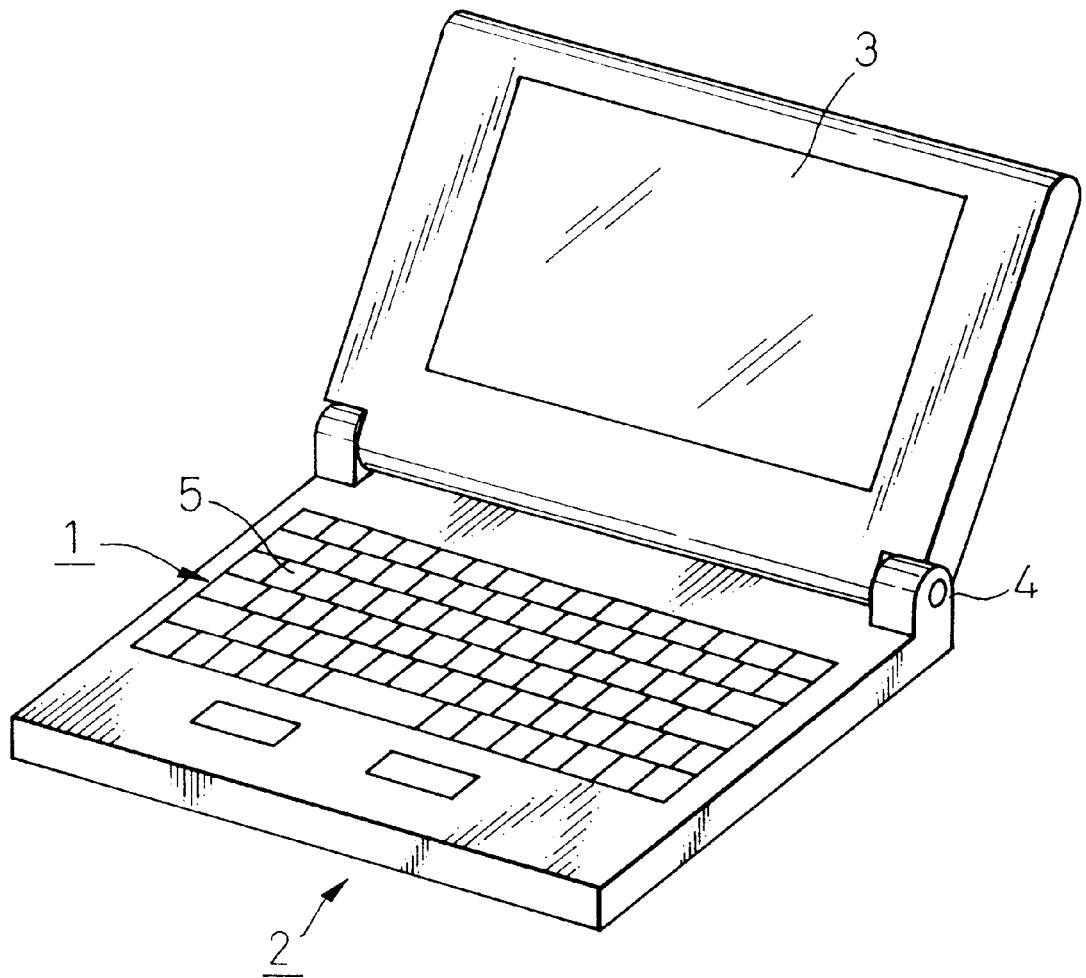
FIG. 5 is a perspective view of a conventional notebook-type computer.

The height of the annular frame 21 such that the top surface of the annular frame 21 is flush with the top surface of the MCM unit 20 (i.e., top surface of the MCM heat radiating plate 17) when the connectors 15 of the MCM unit 20 are coupled with connectors 27 of a motherboard 24. If the MCM heat radiating plate 17 is not provided and lateral extensions 18' having holes 19' are provided on the substrate 10 of the microchip module 16, as shown in FIG. 4, the height of the annular frame 21 should be smaller than that described above by a value corresponding to the thickness of the MCM heat radiating plate 17.

The motherboard 24 is arranged in the computer to mount several electronic components thereto. The motherboard 24 has a ground pattern 25 in the shape identical to the shape of the bottom of the annular frame 21, and a pair of holes 26 at positions in registration with the holes 19 and 22. The motherboard 24 also has connectors 27 to be coupled with the connectors 15 of the MCM unit 20.

A relatively large heat radiating plate 28 made from a good heat conductive metal such as aluminum is arranged above the MCM heat radiating plate 17 and has a pair of lateral extensions or projections having holes 29 at positions in register with the holes 19 of the MCM unit 20. The lateral extensions are arranged on one side of the large heat radiating plate 28.

The large heat radiating plate 28, the MCM heat radiating plate 17, the annular frame 21 with the microchip module 16, and the motherboard 24 are arranged in this order, and fixed together by screws 30 and nuts 31. The screws 30 are passed through the holes 29, 19, 22, and 26, and the nuts 31 are engaged with the screws 30. The microchip module 16 is thus fixed to the motherboard 24 of the notebook type computer, using the annular frame 21, and the heat radiating plates 17 and 28 are conveniently coupled to the MCM mounting structure.

In FIG. 3, the motherboard 24, the annular frame 21, the MCM unit 20, and the large heat radiating plate 28 can be installed in the notebook type computer 32. The keyboard can be subsequently installed to complete the assembly of the notebook type computer 32. Therefore, the arrangement and the assembly work of the MCM mounting structure are simple.

When the annular frame 21 is made from an insulating material such as plastics or ceramics, the MCM unit 20 is inserted in the annular frame 21 and the annular frame 21 with the MCM unit 20 is placed on the motherboard 24. The connectors 15 of the microchip module 16 are coupled with the connectors 27 of the motherboard 24 and the annular frame 21 is located on the ground pattern 25 of the motherboard 24. The large heat radiating plate 28 is placed on the MCM heat radiating plate 17, and screws 30 are passed through the holes 29, 19, 22 and 26. Nuts 31 are then engaged with the screws 30. In this manner, the MCM unit 20 is fixed to the motherboard 24, using the annular frame 21 which surrounds the MCM unit 20 (the microchip module 16). Therefore, the MCM unit 20 (the microchip module 16) is protected by the annular frame 21, and it is possible to prevent the connectors 15 from being undesirably uncoupled from the connectors 27 even when the MCM unit 20 (the microchip module 16) is subjected to vibration and impact.

When the annular frame 21 is made from metal, the MCM unit 20 (the microchip module 16) is protected by the annular frame 21, and it is possible to prevent the connectors 15 from being undesirably uncoupled from the connectors 27 even when the MCM unit 20 (the microchip module 16) is subjected to vibration and impact. In addition, heat induced by the microchip module 16 is transmitted to the annular frame 21 which contacts the MCM heat radiating plate 17 which in turn contacts the large heat radiating plate 28. Also, the MCM heat radiating plate 17 contacts the ground pattern 11 of the microchip module 16, and the annular frame 21 also contacts the ground pattern 25 of the motherboard 24. Accordingly, it is possible to improve a grounding function, a heat radiating efficiency, and a shielding function.

As explained hereinabove, according to the present invention, by providing the arrangement including the microchip module and the annular frame surrounding the microchip module to support the same, it is possible to protect the microchip module from vibration and impact, and to improve a grounding function, a heat radiating efficiency, and a shielding function if the annular frame is made from metal. Therefore, it is possible to realize an apparatus, such as a notebook type computer, including a high speed CPU constituted as a microchip module.

What is claimed is:

1. An apparatus, comprising:

a substrate having at least one semiconductor chip;

an annular frame surrounding said substrate to support said substrate; and a heat radiator having at least one first lateral extension having a first hole therethrough, and said annular frame having at least one receiving part to receive said first lateral extension and at least one second lateral extension having a second hole therethrough at positions corresponding with said first lateral extension having the first hole.

2. The apparatus according to claim 1, wherein the heat radiator is arranged on said substrate to form a microchip module unit.

3. The apparatus according to claim 1, wherein said annular frame is made from metal.

4. The apparatus according to claim 3, wherein said annular frame also acts as a heat radiating member.

5. The apparatus according to claim 3, wherein said annular frame also acts as a shielding member.

6. The apparatus according to claim 3, wherein said annular frame also acts as a ground member.

7. An apparatus, comprising:

a substrate having at least one semiconductor chip mounted to said substrate;

an annular frame surrounding said substrate to support said substrate; and a heat radiator, removably connected to the substrate, radiating heat induced by said chip, said heat radiator having at least one first lateral extension having a first hole therethrough, and said annular frame having at least one receiving part to receive said first lateral extension.

8. The apparatus according to claim 7, further comprising a further heat radiator separate from said heat radiator, said further heat radiator being arranged on said substrate to form a microchip module unit.

9. An apparatus, comprising:

a substrate hating at least one semiconductor chip mounted to said substrate;

an annular frame surrounding said substrate to support said substrate;

a heat radiator radiating heat induced by said chip; and a mechanism fixing said annular frame and said heat radiator together, wherein said mechanism comprises said heat radiator having at least one first lateral extension with a first hole therethrough and said annular frame having at least one receiving part to receive said first lateral extension.

10. An apparatus, comprising:

a substrate having at least one semiconductor chip;

an annular frame surrounding the substrate to support the substrate;

a board to which the substrate with the annular frame is fixed; and a mechanism fixing said substrate, said annular frame and said board together, wherein said mechanism comprises said annular frame having at least one first lateral extension with a first hole therethrough and said board having at least one receiving pact to receive said first lateral extension.

11. An apparatus according to claim 10, further comprising a heat radiator arranged on said substrate to form a microchip module unit.

12. The apparatus according to claim 11, wherein the mechanism fixes the heat radiator, the annular frame and the board together.

13. An apparatus, comprising:

a substrate having a first connector and at least one semiconductor chip mounted to said substrate;

a first heat radiator arranged on said substrate, said first heat radiator having at least one first lateral extension having a hole therethrough;

an annular frame surrounding said substrate, said annular frame having at least one receiving part to receive said at least one first lateral extension and at least one second lateral extension having a second hole therethrough at a position corresponding with said at least one first lateral extension having the first hole;

a second heat radiator radiating heat induced by said chip, said second heat radiator having a third hole therethrough at a position corresponding with said first hole;

a board to which said substrate with said annular frame is fixed, said board having a second connector to be coupled with said first connector and a fourth hole therethrough at a position corresponding with said first hole; and at least one screw adapted to pass through said first to fourth holes, said second heat radiator, said first heat radiator, said annular frame, and said board being arranged in this order and fixed together by said at least one screw.

14. The apparatus according to claim 13, further comprising a ground pattern arranged on said board, said ground pattern having a shape identical to a shape at a bottom of said annular frame.

15. The apparatus according to claim 13, wherein said annular frame has a top surface and a height, and said first heat radiator has a top surface, the height of said annular frame being such that the top surface of said annular frame is flush with the top surface of said first heat radiator when said first connector is coupled with said second connector.

16. The apparatus according to claim 13, wherein said annular frame has a substantially rectangular shape with four side walls, and said at least one first lateral extension comprises a pair of lateral extensions arranged on a pair of opposite side walls.

17. The apparatus according to claim 16, wherein said second heat radiator has one side, and said at least one third lateral extension comprises a pair of lateral extensions arranged on said one side.

18. The apparatus according to claim 13, wherein said apparatus comprises a computer.

19. The apparatus according to claim 13, wherein said at least one semiconductor chip comprises a CPU.

20. An apparatus, comprising:
   a substrate having at least one semiconductor chip mounted to the substrate;
   an annular frame surrounding the substrate to support said substrate, and acting as a ground member; and
   a heat radiator arranged on the substrate to form a microchip module unit, said heat radiator having at least one first lateral extension having a first hole therethrough, and said annular frame having at least one receiving part to receive said first lateral extension.

21. The apparatus according to claim 20, wherein
   the heat radiator further having at least one second lateral extension, having a second hole therethrough, at a position not corresponding with said first lateral extension.

22. The apparatus according to claim 20, wherein said annular frame is made from metal.

23. The apparatus according to claim 1, wherein said annular frame acts as a heat radiator.

24. The apparatus according to claim 1, wherein said annular frame acts as a shielding member.

25. The apparatus according to claim 1, wherein the substrate forms a microchip module.

26. The apparatus according to claim 1, wherein the heat radiator is a heat radiating plate.

27. The apparatus according to claim 13, wherein the first heat radiator is a first heat radiating plate, and the second heat radiator is a second heat radiating plate.

* * * * *

UNITED STATES PATENT AND TRADEMARK OFFICE
CERTIFICATE OF CORRECTION

PATENT NO.   : 6,094,348
DATED        : July 25, 2000
INVENTOR(S)  : Ko Kanbayashi et al.

It is certified that error appears in the above-identified patent and that said Letters Patent is hereby corrected as shown below:

<u>Title page,</u>
Item [56], OTHER PUBLICATIONS, change "8-087364" to
-- 8-087354 --.

<u>Column 5,</u>
Line 66, change "hating" to -- having --.

<u>Column 6,</u>
Line 21, change "pact" to -- part --.

Signed and Sealed this

Fifth Day of August, 2003

JAMES E. ROGAN
*Director of the United States Patent and Trademark Office*